United States Patent
Ho et al.

(10) Patent No.: US 7,078,817 B2
(45) Date of Patent: *Jul. 18, 2006

(54) MULTIPLE COPPER VIAS FOR INTEGRATED CIRCUIT METALLIZATION

(75) Inventors: Paul S. Ho, Austin, TX (US); Ki-Don Lee, Austin, TX (US); Ennis Ogawa, Austin, TX (US); Hideki Matsuhashi, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/010,596

(22) Filed: Dec. 13, 2004

(65) Prior Publication Data

US 2005/0093163 A1    May 5, 2005

Related U.S. Application Data

(63) Continuation of application No. 10/271,284, filed on Oct. 15, 2002, now Pat. No. 6,919,639.

(51) Int. Cl.
*H01L 23/48*     (2006.01)
*H01L 23/52*     (2006.01)
*H01L 29/40*     (2006.01)

(52) U.S. Cl. ..................... 257/774; 257/758
(58) Field of Classification Search ............... 257/758, 257/774
See application file for complete search history.

(56) References Cited

U.S. PATENT DOCUMENTS

| | | | |
|---|---|---|---|
| 5,218,303 A | 6/1993 | Medvinsky | |
| 5,734,187 A * | 3/1998 | Bohr et al. | 257/377 |
| 5,989,623 A | 11/1999 | Chen et al. | |
| 6,023,102 A | 2/2000 | Nguyen et al. | |
| 6,114,243 A | 9/2000 | Gupta et al. | |
| 6,166,442 A | 12/2000 | Nakamura | |

(Continued)

FOREIGN PATENT DOCUMENTS

JP          3-77324       4/1991

(Continued)

OTHER PUBLICATIONS

Ueno et al., *A High Reliability Copper Dual-Damascene Interconnection With Direct-Contact Via Structure*, AIP Conference Proceedings on Stress Induced Phenomena in Metallization: Sixth International Workshop, 2001, pp. 49-60.

(Continued)

*Primary Examiner*—Evan Pert
*Assistant Examiner*—Victor A. Mandala, Jr.
(74) *Attorney, Agent, or Firm*—Myers Bigel Sibley & Sajovec

(57) ABSTRACT

Electromigration can be reduced in a copper-based metallization of an integrated circuit that includes a first copper-containing via that electrically connects an underlying conductive line and an overlying copper-containing line through an intervening insulating layer. Electromigration can be reduced by forming at least a second copper-containing via that electrically connects the underlying conductive line and the overlying copper-containing line through the intervening insulating layer, in parallel with the first copper-containing via. Multi-vias can provide redundancy to reduce early failure statistics. Moreover, since current is distributed among the vias, the electromigration driving force can be reduced and local Joule heating, in voids at the via interface, also may be reduced. Accordingly, even if via voids are formed, the structure may not fail by catastrophic thermal runaway due to Joule heating.

23 Claims, 7 Drawing Sheets

U.S. PATENT DOCUMENTS

| | | | |
|---|---|---|---|
| 6,207,222 | B1 | 3/2001 | Chen et al. |
| 6,308,732 | B1 | 10/2001 | Herndon |
| 6,329,719 | B1 | 12/2001 | Nakamura |
| 6,350,688 | B1 | 2/2002 | Liu et al. |
| 6,495,918 | B1* | 12/2002 | Brintzinger ............... 257/758 |
| 6,667,552 | B1* | 12/2003 | Buynoski .................. 257/758 |
| 6,908,841 | B1* | 6/2005 | Burrell et al. ............. 438/612 |
| 6,919,639 | B1* | 7/2005 | Ho et al. .................. 257/774 |
| 2001/0053592 | A1 | 12/2001 | Sone |
| 2004/0058520 | A1* | 3/2004 | Burrell et al. ............. 438/612 |

FOREIGN PATENT DOCUMENTS

JP            11-214628          8/1999

OTHER PUBLICATIONS

Lee et al., *Statistical Study of Electromigration Early Failures in Dual-Damascene Cu/oxide Interconnects*, AIP Conference Proceedings on Stress Induced Phenomena in Metallization: Sixth International Workshop, 2001, pp. 61-73.

Huang et al., *Comparative Study of the Effect of Misalignment on Bordered and Borderless Contacts*, Journal of Electronic Materials, vol. 30, No. 4, 2001, pp. 360-366.

Ogawa et al., *Statistics of Electromigration Early Failures in Cu/Oxide Dual-Damascene Interconnects*, 2001 IEEE International Reliability Physics Symposium Proceedings, 39$^{th}$ Annual, 2001, pp. 341-349.

Gall et al., *Statistical Analysis of Early Failures in Electromigration*, Journal of Applied Physics, vol. 90, No. 2, Jul. 15, 2001, pp. 732-740.

Guo et al., *Effect of W-Plug Via on Electromigration Lifetime of Metal Interconnect*, IEEE, 2000, pp. 149-151.

Qiang et al., *Impact of Test Structure Design on Electromigration of Metal Interconnect*, IEEE Proceedings of 7$^{th}$ IPFA, 1999, pp. 39-43.

Ogawa et al., *Electromigration Reliability of Dual-Damascene Cu/Oxide Interconnects*, Mat. Res. Soc. Symp. Proc., vol. 612, 2000, pp. D2.3.1-D2.3.6.

Blaschke et al., *Low Temperature PVD Cu Seed for Cu Electroplating of Damascene Trenches in a Low-K Dielectric*, Conference Proceedings ULSI XIV, 1999, pp. 43-49.

Hu et al., *Copper Interconnections and Reliability*, Materials Chemistry and Physics, vol. 52, 1998, pp. 5-16.

Hu et al., *Electromigration in 0.25 µm Wide Cu Line on W*, Thin Solid Films, vols. 308-309, 1997, pp. 443-447.

\* cited by examiner

MULTIPLE COPPER VIAS FOR INTEGRATED CIRCUIT METALLIZATION

CROSS-REFERENCE TO RELATED APPLICATION

This application is a continuation of application Ser. No. 10/271,284, filed Oct. 15, 2002 (now U.S. Pat. No. 6,919, 639), entitled Multiple Copper Vias for Integrated Circuit Metallization and Methods of Fabricating Same, assigned to the assignee of the present application, the disclosure of which is hereby incorporated herein by reference in its entirety as if set forth fully herein.

FIELD OF THE INVENTION

This invention relates to integrated circuits and fabrication methods therefor, and more specifically to copper-based interconnect metallization for integrated circuits and fabrication methods therefor.

BACKGROUND OF THE INVENTION

Integrated circuits are widely used in consumer, commercial and industrial applications. As is well known to those having skill in the art, an integrated circuit may comprise an integrated circuit substrate, such as a silicon semiconductor substrate including a plurality of a microelectronic devices therein, and an interconnect system on the integrated circuit substrate for selectively interconnecting the microelectronic devices and/or for providing power supply and/or input/output connections. As the integration density of integrated circuit devices continues to increase, it may be difficult to form interconnections among these high density microelectronic devices with sufficient quality and/or reliability.

Copper is being investigated and used as a high quality and/or high reliability interconnect metal for high density integrated circuits. Copper-based interconnect systems may replace aluminum, tungsten via/aluminum-copper wire, and/or other integrated circuit interconnect systems.

One method for fabricating copper interconnects is referred to as a "damascene" or "dual-damascene" method. In a damascene method, an underlying conductive layer is covered with a dielectric or insulator, such as silicon dioxide. A patterned photoresist profile is then formed over the dielectric, and an interconnection trench or groove is etched into the dielectric. Another layer of resist has an opening or hole overlying the trench, corresponding to the area in the dielectric where a via is to be formed. The dielectric not covered with the photoresist is then etched to remove oxide underlying the hole in the photoresist to create vias in the dielectric. The photoresist is then stripped away. A thin film of copper, or some other metallic material, then is used to fill the via and trench. The excess copper remaining is removed, for example using Chemical Mechanical Polishing (CMP). The result is an inlaid or damascene structure in the dielectric layer. See U.S. Pat. No. 6,023,102 to Nguyen et al., entitled Low Resistance Contact Between Circuit Metal Levels, Column 2, lines 27–46. Other copper damascene structures and fabrication processes are described in U.S. Pat. No. 5,989,623 to Chen et al., entitled Dual Damascene Metallization; U.S. Pat. No. 6,114,243 to Gupta et al., entitled Method to Avoid Copper Contamination on the Sidewall of a Via or a Dual Damascene Structure; U.S. Pat. No. 6,207,222 to Chen et al., entitled Dual Damascene Metallization; U.S. Pat. No. 6,218,303 to Lin entitled Via Formation Using Oxide Reduction of Underlying Copper; and U.S. Pat. No. 6,350,688 to Liu et al., entitled Via RC Improvement for Copper Damascene and Beyond Technology.

It is well known that electromigration can impact the reliability of metal-based interconnects for integrated circuits. As is well known to those having skill in the art, electromigration is the motion of ions of a conductor, such as aluminum or copper, in response to the passage of current through it. A divergence of ionic flux can lead to an accumulation of vacancies or voids in the conductor. These voids may grow to be a large enough size so as to cause an open circuit failure of the conductor.

Electromigration has been studied in copper interconnects. See, for example, the publication by Hu et al., *Copper Interconnections and Reliability*, Materials Chemistry and Physics, Vol. 52, 1998, pp. 5–16; Hu et al., Electromigration in 0.25 µm Wide Cu Line on W, Thin Solid Films, Vol. 308–309, 1997, pp. 443–447 and by Ogawa et al., *Electromigration Reliability of Dual-Damascene Cu/Oxide Interconnects*, Materials Research Society Symposia Proceedings, Vol. 612, 2000, pp. D2.3.1–D.2.3.6.

Statistical studies have revealed multi-mode failures in copper-based dual-damascene structures, one mode of failure due to void formation at the via interface and other modes comprising void formation in the line or metal extrusion near the end of the metal line. Void formation at the via interface usually occurs faster than other failure modes, therefore it dominates the early failures of copper interconnects. See, for example, the publication by Gall et al., *Statistical Analysis of Early Failures in Electromigration*, Journal of Applied Physics, Vol. 90, 2001, p. 732–740; Ogawa et al., *Statistics of Electromigration Early Failures in Cu/Oxide Dual-Damascene Interconnects*, 2001 IEEE International Reliability Physics Symposium Proceedings, 39$^{th}$ Annual, 2001, pp. 341–349; and Lee et al., *Statistical Study of Electromigration Early Failures in Dual-Damascene Cu/Oxide Interconnects*, AIP Conference Proceedings on Stress Induced Phenomena in Metallization: Sixth International Workshop, 2001, pp. 61–73. Early failures may be a significant concern, since they may dominate the lifetime of the integrated circuit as the device scaling results in increasing interconnect density. Electromigration failure at the via may be caused by flux divergence occurring at the via/line interface due to the presence of a diffusion barrier and due to the via geometry.

Attempts have been made to improve the electromigration resistance of copper-based interconnects. One attempt is described in Ueno et al., *A High Reliability Copper Dual-Damascene Interconnection With Direct-Contact Via Structure*, AIP Conference Proceedings on Stress Induced Phenomena in Metallization: Sixth International Workshop, 2001, pp. 49–60. As described therein, a new via technology for improving electromigration (EM) reliability of copper (Cu) dual-damascene (DD) interconnection has been developed. Early failure mode of a conventional Cu DD structure is found as void formation at the via-bottom interface, where flux divergence of Cu ions is large due to diffusion barrier layer. In order to avoid the early failures, direct-contact via (DCV) technology whose concept is "barrier-free" at the via-bottom has been developed. The early failure mode is eliminated by the DCV technology and lower via resistance is obtained.

Another attempt at improving the electromigration reliability of copper-based interconnects is described in U.S. Pat. No. 6,306,732 to Brown, entitled Method and Apparatus for Simultaneously Improving the Electromigration Reliability and Resistance of Damascene Vias Using A Controlled Diffusivity Barrier. As described therein, an apparatus for improving electromigration reliability and resistance of a single- or dual-damascene via includes an imperfect barrier formed at the bottom of the via, and a stronger barrier formed at all other portions of the via. The imperfect barrier allows for metal atoms, such as copper atoms, to flow therethrough when the electromigration force pushes the metal atoms against the barrier. That way, the metal atoms that are pushed away from the downstream side of the barrier are replaced by metal atoms that flow through the barrier from the upstream side of the barrier. The imperfect barrier may be formed by biasing a wafer, and having the atoms resputter from the bottom of the via and adhere to the sidewalls of the via. The imperfect barrier may also be formed by a two-layered barrier, where a first layer corresponds to a good step coverage, poor barrier, and where the second barrier corresponds to a poor step coverage, good barrier. The imperfect barrier may also be formed by depositing the barrier conformally, and providing a directional etch to the portions of the barrier that are deposited to the bottom of the via. See the Brown Abstract.

SUMMARY OF THE INVENTION

Some embodiments of the present invention can reduce electromigration in a copper-based metallization of an integrated circuit that includes a first copper-containing via (i.e., a via comprising copper) that electrically connects an underlying conductive line and an overlying copper-containing line through an intervening insulating layer. According to some embodiments of the invention, at least a second copper-containing via is formed that electrically connects the underlying conductive line and the overlying copper-containing line through the intervening insulating layer, in parallel with the first copper-containing via. Without wishing to be bound by any theory of operation, it has been found, according to some embodiments of the present invention, that multi-vias can provide redundancy to improve early failure statistics. Moreover, since current is distributed among the multi-vias, the electromigration driving force can be reduced and local Joule heating in voids at the via interface, also may be reduced. Accordingly, even if via voids are formed, the structure may not fail by catastrophic thermal runaway due to Joule heating.

Other embodiments of the present invention provide metallization methods for an integrated circuit substrate. In these embodiments, a conductive line is formed on the integrated circuit substrate. An insulating layer is formed on the integrated circuit substrate including on the conductive line. The insulating layer includes a groove and a plurality of vias in the groove that expose the conductive line. A layer comprising copper (i.e., a copper-containing layer) is formed in the groove and in the plurality of vias in the groove.

Interconnect systems according to some embodiments of the invention are used to electrically connect an underlying conductive line and an overlying copper-containing line on an integrated circuit substrate through an intervening insulating layer. These interconnect systems according to some embodiments of the invention include a plurality of copper-containing vias that are configured to electrically connect the underlying conductive line and the overlying copper-containing line in parallel through the intervening insulating layer.

Integrated circuits according to some embodiments of the present invention comprise an integrated circuit substrate including a plurality of microelectronic devices therein. A conductive line is on the integrated circuit substrate. An insulating layer is on the integrated circuit substrate, including on the conductive line. The insulating layer includes a groove and a plurality of vias in the groove that expose the conductive line. A layer comprising copper is in the groove and in the plurality of vias in the groove.

In some embodiments of the invention, the plurality of vias are at an end of the groove. In other embodiments of the present invention, the plurality of vias at the end of the groove consists of three vias. In yet other embodiments of the invention, the layer comprising copper comprises a conformal sublayer and a copper-containing sublayer on the conformal sublayer. The conformal sublayer can be a barrier layer, a plating seed layer and/or other layers. In still other embodiments, the layer comprising copper fills the groove and the fills plurality of vias in the groove.

In still other embodiments of the present invention, the conductive line is a first conductive line, the end of the groove is a first end of the groove and the plurality of vias is a plurality of first vias. In some embodiments, the integrated circuit further includes a second conductive line on the integrated substrate, and the insulating layer further includes a plurality of second vias at a second end of the groove that expose the second conductive line. In these embodiments, the layer comprising copper also is in the plurality of second grooves. In some embodiments, the plurality of second vias at the second end of the groove consists of three vias at the second end of the groove.

DETAILED DESCRIPTION OF PREFERRED EMBODIMENTS

Figure 1:
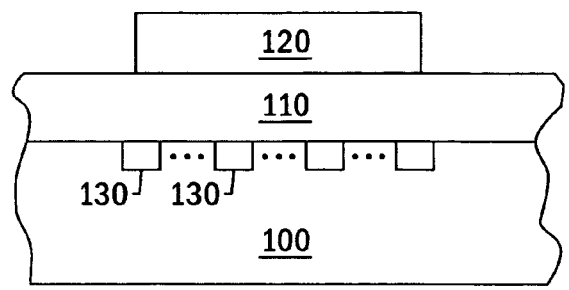
FIGS. 1–4 are cross-sectional views of integrated circuits according to some embodiments of the invention, including interconnect systems according to some embodiments of the present invention, during intermediate fabrication steps according to some embodiments of the present invention.

The present invention now will be described more fully hereinafter with reference to the accompanying figures, in which embodiments of the invention are shown. This invention, however, should not be construed as limited to the embodiments set forth herein.

Accordingly, while the invention is susceptible to various modifications, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

Like numbers refer to like elements throughout the description of the figures. In the figures, the dimensions of layers and regions may be exaggerated for clarity. It will also be understood that when an element, such as a layer, region or substrate, is referred to as being "on" or "connected to" another element, it can be directly on or directly connected to the other element or intervening elements may also be present. In contrast, when an element, such as a layer, region or substrate, is referred to as being "directly on" or "directly connected to" another element, there are no intervening elements present.

FIGS. 1–4 are cross-sectional views of integrated circuits according to some embodiments of the present invention during intermediate fabrication steps according to some embodiments of the present invention. Referring now to FIG. 1, a conductive line 120 is formed on an integrated circuit substrate 100. The integrated circuit substrate 100 may comprise a conventional silicon semiconductor substrate, a silicon-on-insulator substrate, a compound semiconductor substrate, such as gallium arsenide or gallium nitride, and/or other conventional microelectronic substrates. It will be understood that the substrate 100 also may include a base substrate and one or more layers on the base substrate. A plurality of active and/or passive microelectronic devices 130, such as transistors, diodes, resistors, capacitors and/or other devices are formed in and/or on the integrated circuit substrate 100. The microelectronic devices 130 also may include optoelectronic and/or microelectromechanical devices. The fabrication of the integrated circuit substrate 100 and the microelectronic devices 130 are well known to those having skill in the art and need not be described further herein.

Still referring to FIG. 1, an insulating layer 110 comprising, for example, silicon dioxide, silicon nitride, organic insulators and/or other conventional insulating layer(s) may be provided on substrate 100. The insulating layer 110 may be used to insulate the microelectronic devices 130 from the conductive line 120. A plurality of insulating sublayers also may be provided. The fabrication of an insulating layer 110 on an integrated circuit substrate 100 is well known to those having skill in the art, and need not be described further herein.

Still referring to FIG. 1, the conductive line 120 is provided on the insulating layer 110 opposite the integrated circuit substrate 100. In other embodiments, the conductive line 120 may be directly on the integrated circuit substrate 100. In some embodiments, the conductive line 120 comprises metal, such as copper-based metallization, aluminum-based metallization and/or other metallization systems. In still other embodiments, the conductive line 120 may comprise conductive polysilicon and/or other conductive materials. Combinations of metal and nonmetal also may be used. These materials are well known to those having skill in the art and need not be described further herein.

It also will be understood by those having skill in the art that, more than one conductive line 120 may be formed on the integrated circuit substrate 100. In fact, in some embodiments, large numbers of conductive lines 120 may be formed on the integrated circuit substrate 100, for example by blanket-forming a conductive material on the integrated circuit substrate 100 and then patterning the conductive material to form a large number of conductive lines 120. Only a single conductive line 120 is shown in FIG. 1 for the sake of clarity. Finally, it also will be understood that there can be other conductive layers between the conductive line 120 and the integrated circuit substrate in some embodiments. The fabrication of one or more conductive lines 120 on the integrated circuit substrate 100 is well known to those having skill in the art and need not be described further herein.

Figure 2:
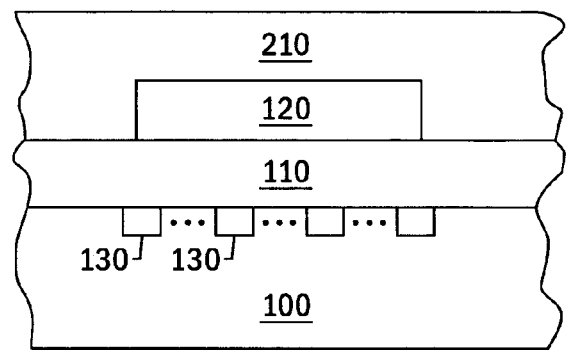

Referring now to FIG. 2, an insulating layer(s) 210 is formed on the integrated circuit substrate 100, including on the conductive line 120. The insulating layer 210 may comprise silicon dioxide, silicon nitride, other inorganic or organic insulating materials and/or other conventional insulating materials. The insulating layer 210 also may comprise a plurality of sublayers. The fabrication of the insulating layer 210 is well known to those having skill in the art and need not be described further herein.

Figure 3:
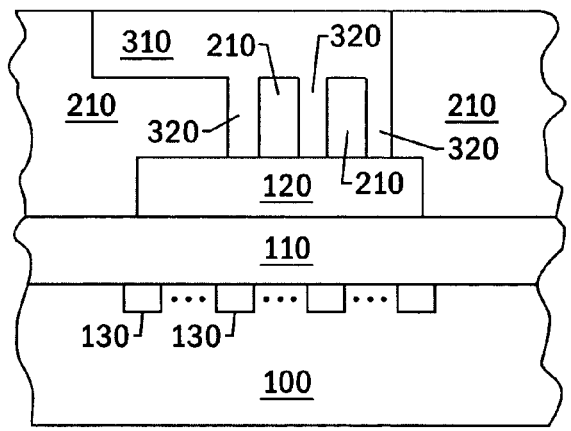

Referring now to FIG. 3, the insulating layer 210 is patterned to include therein a groove 310, which may also be referred to as a trench, and a plurality of vias 320, which also may be referred to as through-holes, in the groove 310 that expose the conductive line 120. The groove 310 and the plurality of vias 320 may be fabricated using two separate photolithography steps in a dual-damascene process using two separate masks, as was described above. However, other techniques may be used to form the insulating layer 210, including the groove 310 and the plurality of vias 320 therein, such as selective deposition, liftoff and/or other conventional techniques.

It also will be understood that, in FIG. 3, the plurality of vias 320 are illustrated at an end of the groove 310. In other embodiments, the plurality of vias may be formed in the center of the groove and/or at both ends of the groove, as will be described in detail below. The plurality of vias 320 comprises two or more vias 320. In some embodiments of the present invention, as shown in FIG. 3, three vias 320 are provided.

Figure 4:
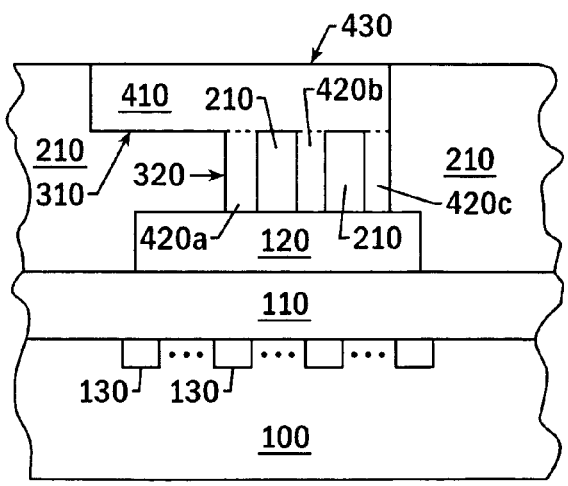

Referring now to FIG. 4, a layer 430 comprising copper (also referred to as a copper-containing layer) is formed in the groove 310 and in the plurality of vias 320. The layer comprising copper may be fabricated by Chemical Vapor Deposition (CVD), Physical Vapor Deposition (PVD), sputtering, plating and/or other conventional techniques, and may be followed by Reactive Ion Etching (RIE), sputter etching, other etching and/or Chemical Mechanical Polishing (CMP). In some embodiments, the layer comprising copper is pure copper. In other embodiments, the layer comprising copper is at least 90% copper. In still other embodiments, the layer comprising copper is at least 50% copper. The fabrication of a layer 430 comprising copper is well known to those having skill in the art and need not be described further herein. It also will be understood that the layer 430 comprising copper may include a plurality of sublayers, such as a conformal sublayer or sublayers that can function as a barrier, plating seed and/or other function, and a copper-containing sublayer on the conformal sublayer.

Still referring to FIG. 4, integrated circuits according to some embodiments of the present invention comprise an integrated circuit substrate 100, including a plurality of microelectronic devices 130 therein. A conductive line 120 is on the integrated circuit substrate. An insulating layer 210 is on the integrated circuit substrate including on the conductive line 120. The insulating layer 210 includes a groove 310 and a plurality of vias 320 in the groove 310 that expose the conductive line 120. A layer 430 comprising copper is in the groove and in the plurality of vias in the groove.

Accordingly, some embodiments of the present invention can provide an interconnect system for electrically connecting an underlying conductive line 120 and an overlying copper-containing line 410 on an integrated circuit substrate 100 through an intervening insulating layer 210. In these embodiments, the interconnect system comprises a plurality of copper-containing vias 420a–420c that are configured to electrically connect the underlying conductive line 120 and the overlying copper-containing line 410 in parallel, through the intervening insulating layer 210. This connection can be a direct electrical connection as shown in FIG. 4, or one or more intervening layers also may be provided. It will be understood that the composition of the copper-containing line 410 and the copper-containing vias 420a–420c may be the same in some embodiments and different in other embodiments.

It also will be understood that some embodiments of the present invention can include a plurality of copper-containing vias that are aligned parallel to the copper-containing line. In other embodiments, the copper-containing vias can be arranged in a square, rectangular and/or other two-dimensional array. Moreover, copper-containing vias of different sizes can be grouped together. The design of the multiple vias may depend on the amount of space available, the current carrying capacity of the interconnect and/or other factors.

FIGS. 1–4 also illustrate methods of reducing electromigration in a copper-based metallization of an integrated circuit substrate 100 according to some embodiments of the present invention. As shown in FIG. 4, the integrated circuit includes a first copper-containing via, for example via 420c that electrically connects an underlying conductive line 120 and an overlying copper-containing line 410 through an intervening insulating layer 210. Electromigration reducing methods according to some embodiments of the present invention form at least a second copper-containing via 420a–420b, that electrically connects the underlying conductive line 120 and the overlying copper-containing line 410 through the intervening insulating layer 210 in parallel with the first copper-containing via 420c.

Figure 5:
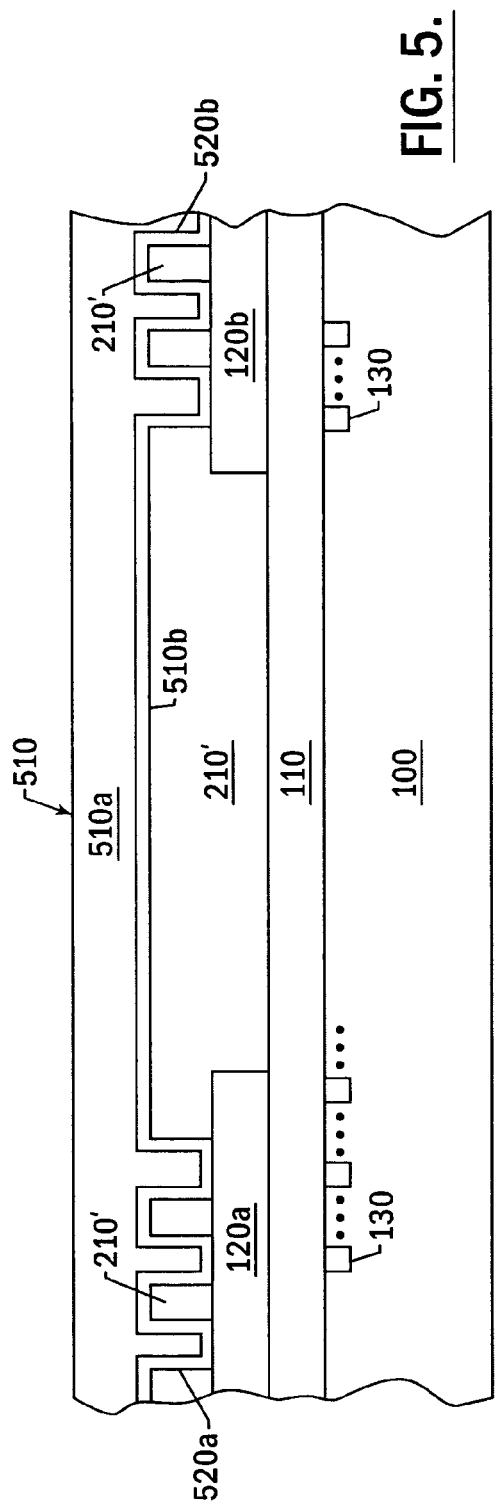
FIGS. 5 and 6 are cross-sectional views of other integrated circuits according to some embodiments of the invention, including interconnect systems according to some embodiments of the present invention.

FIG. 5 is a cross-sectional view of integrated circuits according to other embodiments of the present invention. In particular, in FIG. 5, a first conductive line 120a and a second conductive line 120b are provided on an integrated circuit substrate 100, and a layer 510 comprising copper is provided in a groove in an insulating layer 210', wherein the insulating layer 210' includes a plurality of first vias 520a that expose the first conductive line 120a and a plurality of second vias 520b that expose the second conductive line. As also shown in FIG. 5, the plurality of first vias 520a is at a first end of the groove and the plurality of second vias 520b is at the second end of the groove. The layer 510 comprising copper is in the groove, in the plurality of first vias 520a and in the plurality of second vias 520b.

As shown in FIG. 5, different numbers of first vias 520a and second vias 520b may be used. In other embodiments, the same number of first vias 520a and second vias 520b may be used. Moreover, as also shown in FIG. 5, the layer 510 comprising copper can include a conformal sublayer 510b and a copper-containing sublayer 510a. As also shown in FIG. 5, the layer 510 comprising copper can fill the vias 520a and 520b.

Accordingly, in FIG. 5, multiple vias may be provided at both ends of an overlying copper-containing line 510 to connect to two underlying lines 120a, 120b. It will be understood that, in some embodiments, a pattern comprising a large number of overlying copper-containing lines and underlying conductive lines may be provided in a conventional large-scale integrated circuit, with at least some of the connections therebetween being provided by multiple copper-containing vias that electrically connect an underlying conductive line and an overlying copper line in parallel.

Figure 6:
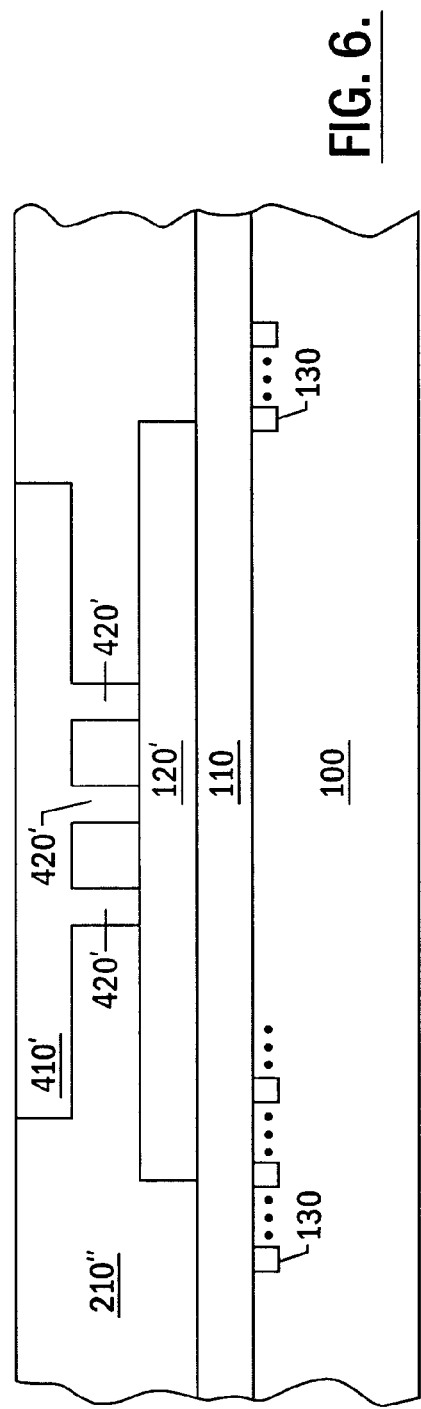

FIG. 6 is a cross-sectional view of integrated circuits according to other embodiments of the present invention. As shown in FIG. 6, multiple copper-containing vias 420' may be used to connect an underlying conductive layer 120' and an overlying copper-containing line 410' at intermediate portions of the underlying conductive line 120' and/or the overlying copper-containing line 410'.

Additional qualitative and quantitative discussion of some embodiments of the present invention now will be provided. These discussions report the results of an experimental study on the effect of multi-via structures according to some embodiments of the present invention on electromigration failure statistics, wherein the layer comprising copper is formed in an insulating layer comprising silicon dioxide in a dual-damascene process. The following examples shall be regarded as merely illustrative and shall not be construed as limiting the invention.

The study was carried out using statistical electromigration (EM) test structures with 1 to 3 vias. Without wishing to be bound by any theory of operation, results observed in this study appear to confirm that multi-via structures according to some embodiments of the invention can indeed improve EM early failure statistics. Finite Element Analysis (FEA) was performed to examine the current density distribution in multi-vias. The results appeared to reveal that the improvement comes not only from statistical redundancy but also from a reduction in the current density at individual vias.

EM experiments were performed in a test system designed by the inventors. This system was equipped with a high-vacuum test chamber filled with purified nitrogen where 72 structures can be tested in a temperature range up to 450° C. The system compliance was rated up to 80 V and 10 mA and was designed for testing highly resistive interconnect elements, typical of the statistical test structures used in the study. Multi-channel electronics were set up to provide a constant current and to continuously monitor voltage and current changes for individual test structures. Joule heating was measured and corrected for in the test temperature. Additional details have been described in Ogawa et al., *Electromigration Reliability of Dual-Damascene Interconnects*, Materials Research Society Symposia Proceedings, Vol. 612, 2000, pp. D2.3.1–D.2.3.6, the disclosure of which is hereby incorporated herein by reference in its entirety as if set forth fully herein. It also will be understood that other conventional test systems and structures may be employed.

The samples used for this study were dual-damascene copper wherein the insulating layer 210 was silicon dioxide and the layer comprising copper 410 included a tantalum conformal sublayer seed fabricated by low temperature PVD and an ElectroPlated (EP) copper sublayer. This structure is described in Blaschke et al., *Low-Temperature PVD Cu Seed for Cu Electroplating of Damascene Trenches in a Low-k Dielectric*, Proceedings of the Advanced Metallization Conference, 1998, pp. 43–49, the disclosure of which is hereby incorporated herein by reference in its entirety as if set forth fully herein. The metal lines in the test structures show an apparent "near bamboo" microstructure with a significant amount of twinning that is associated with copper film growth. It also will be understood that other conventional structures may be employed.

Figure 7:
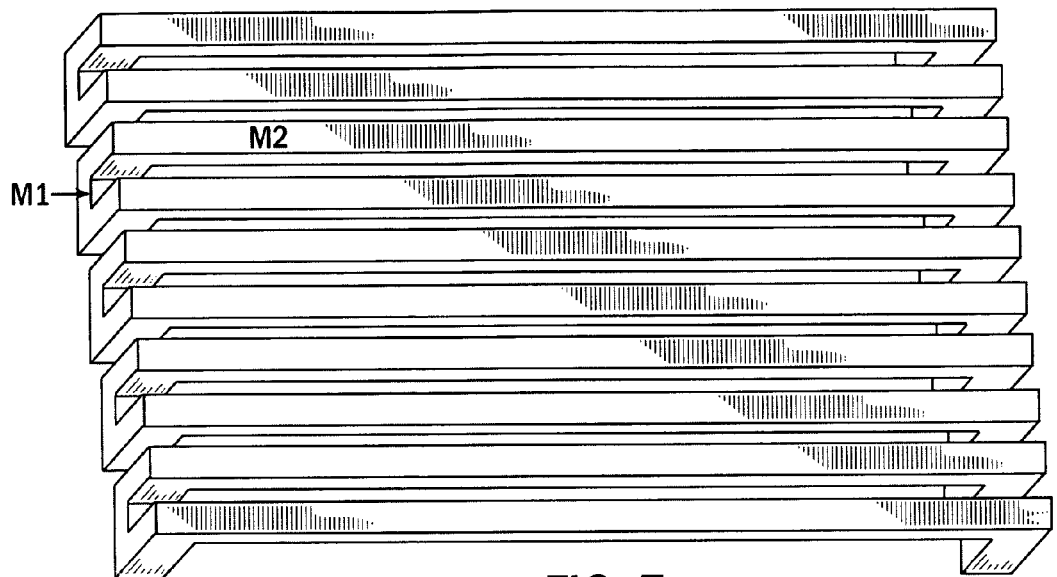
FIG. 7 is a perspective view of an early failure test structure with ten identical via structures serially connected by bridging metal.

The Early Failure (EF) test structure is a collection of serially connected line/via interconnects where N, the number of serial elements, is the statistical parameter for a given set of interconnect dimensions. The lifetimes of different types (N=1, 10, or 100) of EF test structures are used to analyze and determine the characteristics of early failures. See Ogawa et al., *Statistics of Electromigration Early Failures in Cu/Oxide Dual Damascene Interconnects*, 2001 IEEE International Reliability Physics Symposium Proceedings, 39th Annual, 2001, pp. 341–349, the disclosure of which is hereby incorporated herein by reference in its entirety as if set forth fully herein. FIG. 7 shows a perspective view of EF N=10, in which 10 identical M2/via interconnects are serially connected by short M1 (Metal 1) bridging lines. In such a structure, the EF lifetime is determined by the weakest line/via element among the 10 interconnects.

Figure 8A:
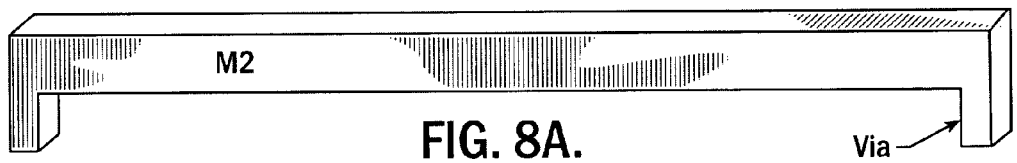
FIGS. 8A–8C are perspective views of interconnect systems including a single copper-containing via, two copper-containing vias according to some embodiments of the present invention, and three copper-containing vias according to some embodiments of the present invention, respectively.
Figure 8B:
Figure 8C:
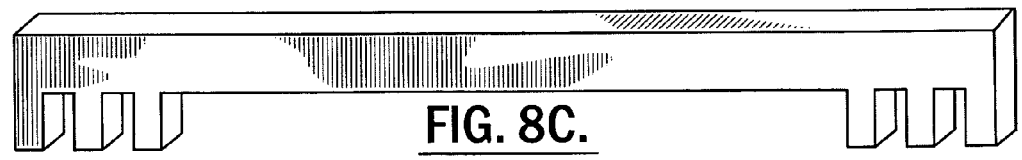

A Via Reliability (VR) structure was designed to measure the effect on EF using multiple copper-containing vias terminating the test line according to some embodiments of the present invention. Three versions of VR were investigated, wherein a single copper-containing M2 line element terminates with 1, 2, or 3 copper-containing vias (FIGS. 8A–8C, respectively). In this case, the controlling parameter is Vn, the number of vias. Since a VR structure with Vn=1 is similar to the EF structure with N=1, so are the lifetime characteristics. To allow consistency of experimental results, test structures were selected from the same wafer. Also, the dimensions of the test lines were fixed at 0.25 μm line width, 0.5 μm line height, 0.25 μm×0.25 μm via area, and 0.4 μm via height.

Figure 9:
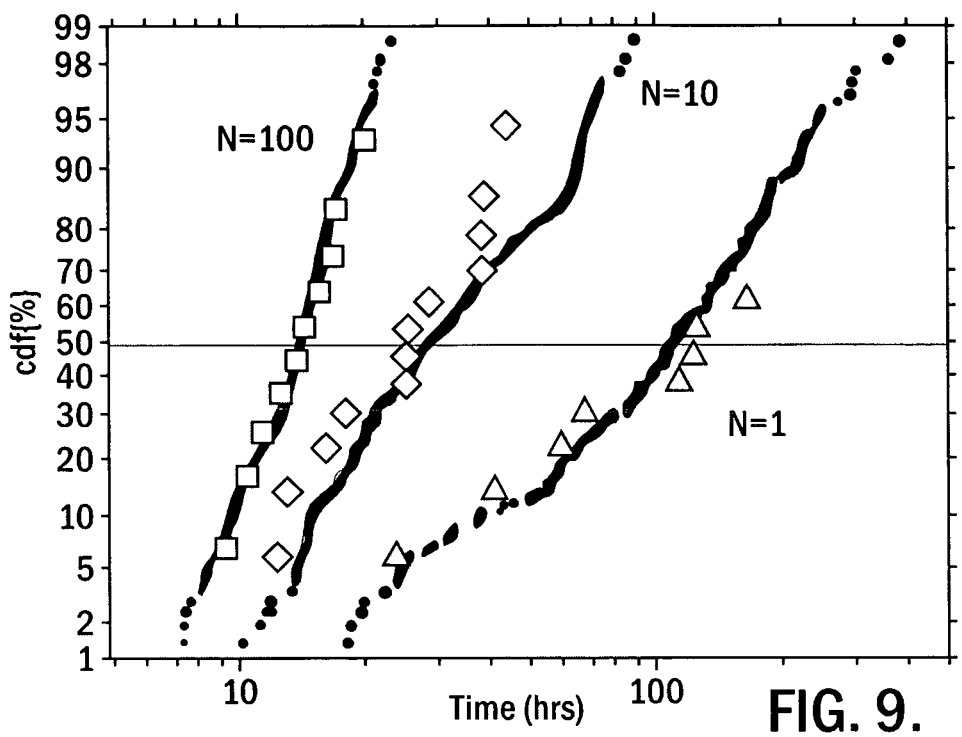
FIG. 9 graphically illustrates Cumulative Distribution Function (CDF) plots of early failure test structures tested at 380° C. and at 1.0 mA/cm$^2$, wherein open symbols indicate the real lifetimes of early failures and the dots are generated by a dual-mode Monte Carlo simulation to fit the real data.

EM results of EF structures tested at 380° C. and 1.0 MA/cm² were used to determine the population of weak mode (early failures) and strong mode failure mechanism using Monte Carlo Simulation. See the above-cited Lee et al. publication. The failure mechanism with a high $t_{50}$ is called the "strong mode," and that with a low $t_{50}$ is called the "weak mode." The dual-mode failure mechanism has been confirmed by direct observation using an FIB imaging technique. See the above-cited Ogawa et al. and Lee et al. publications. EM test results are shown in FIG. 9, where dual-mode failure is manifested by the broading of the failure distribution for N=1. For this structure, a 15% of early failure was found. Table 1 summarizes the dual-mode failure statistics.

TABLE 1

Dual-mode characteristics of EF Test Structures

| | Population | $t_{50}$ | σ |
|---|---|---|---|
| Strong Mode | 85% | 130 hrs. | 0.45 |
| Weak Mode | 15% | 30 hrs. | 0.45 |

Figure 10:
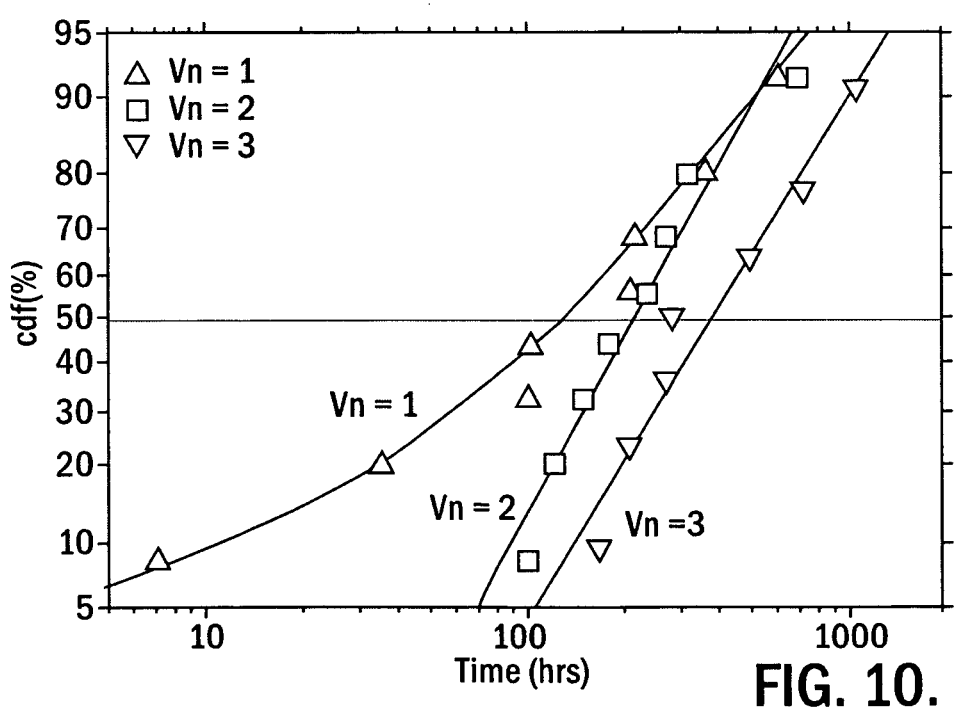
FIG. 10 graphically illustrates CDF plots of via reliability test structures with one copper-containing via, two copper-containing vias according to some embodiments of the invention, and three copper-containing vias according to some embodiments of the invention, tested at 380° C. and 2.0 mA/cm$^2$.
Figure 11:
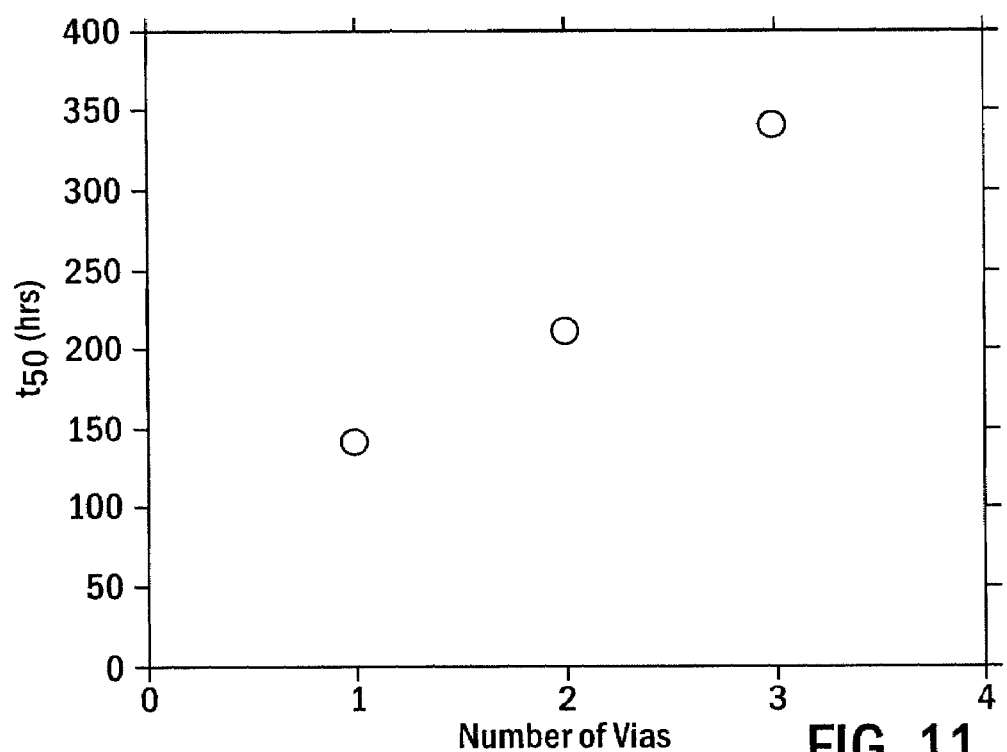
FIG. 11 graphically illustrates failures as a function of the number of copper-containing vias according to some embodiments of the present invention.

EM tests of VR structures were performed at 380° C. and 2.0 MA/cm² to investigate the effect of a multi-via on EM reliability. It will be understood that other parameters may be used. FIG. 10 shows the results obtained for Vn=1, 2, and 3. The Cumulative Distribution Function (CDF) of VR for Vn=1 also is plotted in FIG. 10. As expected, its behavior is similar to that of EF N=1 in FIG. 9 because they are basically single line/single via structures from the same wafer. In FIG. 10, it should be noted that while early failures clearly affect the CDF curve of the Vn=1 structures by increasing its standard deviation (σ) to 1.4, both CDFs of Vn=2 and 3 do not show detectable deviations from a single regression line and yield a σ value of ~0.6. The higher value of standard deviation for the Vn=1 structure indicates that this structure may be more prone to early failures than the Vn=2 and 3 structures. This is evidenced by more failures being detected at short test times, as shown in FIG. 10, for Vn=1 structures. The improvement in $t_{50}$ for multi-via structures is shown in FIG. 11.

Figure 12A:
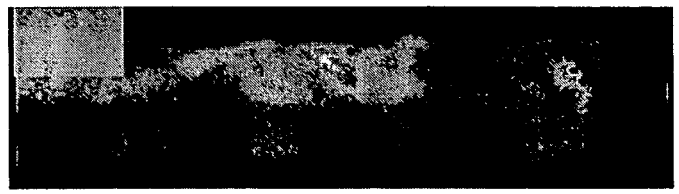
FIGS. 12A–12D are photo-micrographs of void growth for four copper-containing vias, three copper-containing vias, three copper-containing vias and two copper-containing vias, respectively.
Figure 12B:
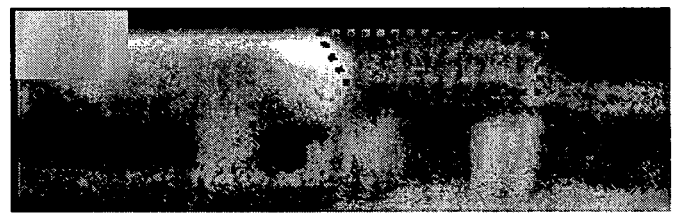
Figure 12C:
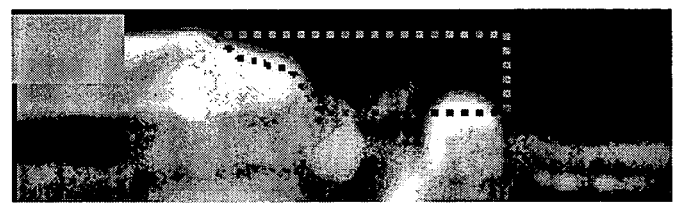
Figure 12D:
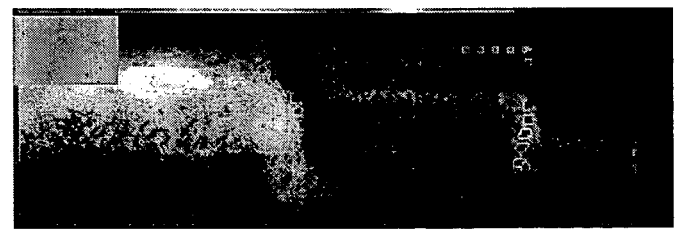

A Focused Ion Beam (FIB) microprobe was used to examine the void nucleation and growth in VR structures. Other techniques also may be used. Cross-sectional FIB images, 45 degree tilted after cutting, are shown in FIGS. 12A–12D. These micrographs show that a void nucleates at the upper corner of the cathode (FIG. 12A) and grows toward the anode until the void interrupts the current flow (FIG. 12D).

Figure 13A:
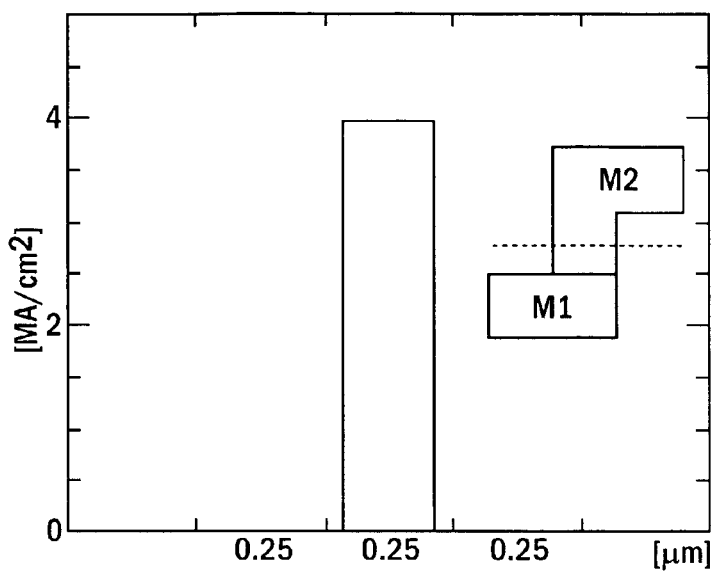
FIG. 13A–C illustrate current distribution in the vias for one copper-containing via, two copper-containing vias and three copper-containing vias, respectively.
Figure 13B:
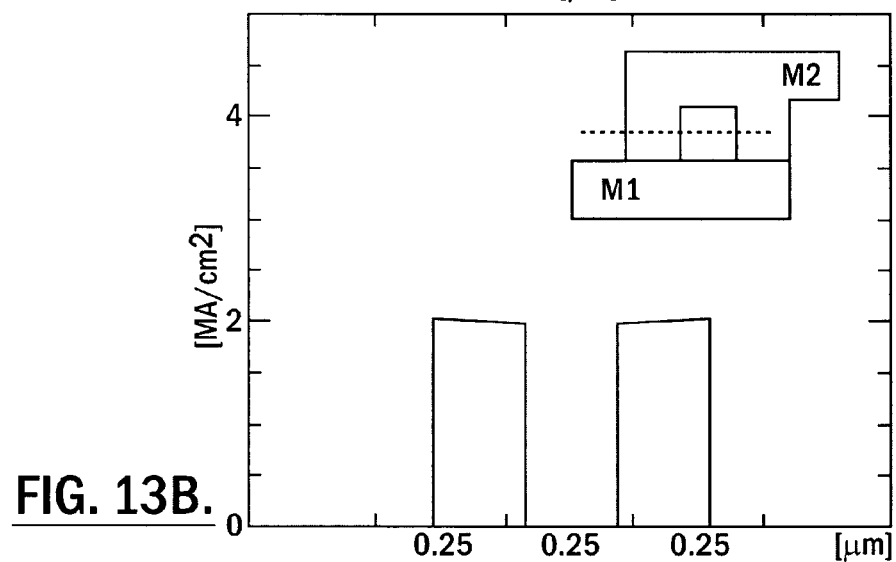
Figure 13C:
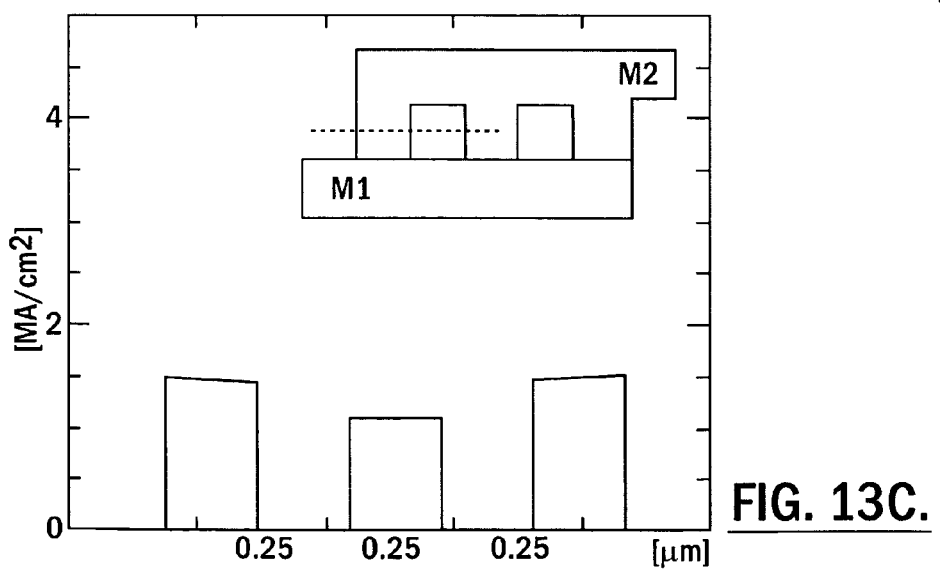

A 3-D FEA was performed using the conventional ABAQUS program to evaluate the current density j distribution in multiple via structures. Other techniques also may be used. In the analysis, a current density of 2.0 MA/cm was applied in the M2 line with the ends of the M1 line grounded as a boundary condition. The electrical resistivity of copper was taken to be 3.72 μΩcm at 380° C., considering a TCR of 0.0034. The current density distributions in the multi-via structures are shown in FIGS. 13A–13C. Note that the current density j in the single via (FIG. 13A) is 4.0 MA/cm², twice that in the line due to the area reduction in the via cross section. Overall, the current density j in a via is reduced with increasing number of vias according to embodiments of the present invention. Also, it appears that current crowding can be modified by changing cross-sectional areas in M1 and M2.

Without wishing to be bound by any theory of operation, a mechanism for multi-vias improving EM reliability may be postulated. A factor appears to be that the multi-vias can provide a redundancy to reduce the EF statistics. In addition, FEA (FIGS. 13A–13C) appears to show that j is distributed among the vias, which can effectively reduce EM driving force and local Joule heating in void formation at the via interface. Combining with the redundancy effect, a via void may form but not fail the structure by catastrophic thermal runaway due to Joule heating. As a result, the above study showed $t_{50}$ increases with increasing number of vias because the amount of mass depletion to induce failure increases.

Accordingly, some embodiments of the invention can provide a potential solution for reducing early failures due to EM in dual-damascene interconnects. As shown in FIG.

13C, j is not evenly distributed among the vias. In particular, the current value at the outer vias of the 3-via structure is higher than that at the center via. Accordingly, in some embodiments of the invention, three vias are used because significant additional reduction in EM may not be obtained for more than three vias.

In other embodiments, however, more than three vias may be used, and in some embodiments, only two vias may be used.

U.S. Pat. Nos. 6,166,442 and 6,329,719, both to Nakamura and both entitled Semiconductor Device, describe a semiconductor device that is comprised of a first wire that has a plurality of via holes formed in the vicinity of an end thereof and that is connected to a conductor of a different layer through the via holes, and a plurality of slits that are provided parallel to the direction in which the first wire extends and that split the first wire into a plurality of second wires over a predetermined distance from the end thereof. Another semiconductor device is comprised of a first wire, a second wire that is on a layer different from that of the first wire and that extends in a direction at right angles to the first wire, a connection area where a portion in the vicinity of an end of the first wire intersects with a portion in the vicinity of an end of the second wire, a plurality of first slits that are provided parallel to the direction in which the first wire extends and that divide the first wire into a plurality of third wires over only a predetermined distance from an end of the first wire, and a plurality of second slits that are provided parallel to the direction in which the second wire extends and that divide the second wire into a plurality of fourth wires over only a predetermined distance from an end of the second wire, and a plurality of via holes that are formed in the connection area and that connect the plurality of third wires and the plurality of fourth wires. See the common Nakamura Abstract. As described in common Column 2, lines 57–61, the plurality of via holes is used in an aluminum-based metallization. Moreover, a publication of Huang et al., entitled *Comparative Study on the Effect of Misalignment on Bordered and Borderless Contacts*, Journal of Electronic Materials, Vol. 30, No. 4, 2001, pp. 360–366, describes an electromigration lifetime increase with increasing number of contacts in series for tungsten via/aluminum-copper metallization systems.

However, other studies appear to note that multiple vias do not proportionately increase lifetime of tungsten via/ aluminum-copper metallization systems. See the publication of Guo et al., entitled *Effect of W-Plug Via on Electromigration Lifetime of Metal Interconnect*, IEEE, 2000, pp. 149–151, wherein the Abstract states that the effect of W-plug via on electromigration (EM) lifetime of the metal interconnects with bamboo structure and single/multiple vias has been systematically investigated by using high resolution resistance measurement (HRRM). It was found that the vias added in the structure significantly change its resistance degradation profile. W-plug vias not only cause discontinuity at the interface between metal and W-plug, but also make the metal stripe near the W-plug via to be more vulnerable to electromigration, further reducing EM lifetime of metal stripe. This finding raises doubt about the assumption that adding multiple vias will proportionately prolong interconnect lifetime in a circuit design. Also, see the publication of Qiang et al., entitled Impact of Test Structure Design on Electromigration of Metal Interconnect, Proceedings of 7$^{th}$ IPFA '99, Singapore, pp. 39–43, wherein the Abstract states that electromigration of the line becomes easier when more vias are added at the end of the line.

Moreover, the EF in a copper system appears to be different than that in tungsten via/aluminum-copper metallization systems. In aluminum-copper metallization systems, the metal lines at adjacent levels generally are connected by interlevel tungsten vias. For these metallization systems, electromigration failure generally occurs by a single mechanism, due to void formation in the aluminum-copper line caused by mass depletion driven by current flow from one end of the aluminum-copper line. In contrast, as was described above, in copper metallization systems, the tungsten via is replaced by a copper-containing via which is connected to a copper-containing line. This configuration generally leads to two electromigration failure modes, one due to void formation in the copper-containing line, and another due to void formation at the bottom of the copper-containing via. The latter appears to dominate early failures, so that it can be a prime factor in controlling reliability of the copper-based metallization. This latter failure mode does not appear to exist for aluminum-copper metallization.

In conclusion, embodiments of the present invention can provide multiple, parallel, copper-containing vias which can improve EM early failure statistics. The multiple copper-containing vias may not only provide a redundancy to improve the EF statistics but also may reduce current density in the vias, which can reduce EM driving force and local Joule heating for void formation at the via interface. As a result, EM lifetime may be increased in addition to an improvement in EF statistics. Embodiments of the invention also may be readily incorporated into a copper dual-damascene interconnect without the need to make extensive changes to the damascene process. Embodiments of the invention also may be used with copper-connecting materials in low dielectric constant materials that may be used in the future.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit comprising:
   an integrated circuit substrate including a plurality of microelectronic devices therein;
   an elongated conductive line on the integrated circuit substrate;
   an insulating layer on the integrated circuit substrate including on the elongated conductive line, the insulating layer including a groove and a plurality of vias in the groove that expose the elongated conductive line; and
   a unitary dual-damascene layer comprising copper in the groove and in the plurality of vias in the groove.

2. An integrated circuit according to claim 1 wherein the plurality of vias are at an end of the groove.

3. An integrated circuit according to claim 2 wherein the plurality of vias consists of three vias at the end of the groove.

4. An integrated circuit according to claim 1 wherein the unitary dual-damascene layer comprising copper in the groove and in the plurality of vias comprises a conformal sublayer and a copper-containing sublayer on the conformal sublayer.

5. An integrated circuit according to claim 1 wherein the unitary dual-damascene layer comprising copper completely fills the groove and completely fills the plurality of vias in the groove.

6. An integrated circuit according to claim 2 wherein the elongated conductive line is a first elongated conductive line, the end of the groove is a first end of the groove and the plurality of vias is a plurality of first vias, the integrated circuit further comprising a second elongated conductive line on the integrated circuit substrate, the insulating layer further including a plurality of second vias at a second end of the groove that expose the second elongated conductive line and wherein the unitary dual-damascene layer comprising copper also is in the plurality of second vias.

7. An integrated circuit according to claim 1 wherein the unitary dual-damascene layer comprising copper in the plurality of vias electrically connects the layer comprising copper in the grooves and the elongated conductive line.

8. An integrated circuit according to claim 7 wherein the unitary dual-damascene layer comprising copper in the plurality of vias electrically connects the layer comprising copper in the grooves and the elongated conductive line in parallel.

9. An integrated circuit according to claim 6 wherein the plurality of second vias at the second end of the groove consists of three vias at the second end of the groove.

10. An interconnect system for electrically connecting an underlying elongated conductive line and an overlying elongated copper-containing line on an integrated circuit substrate through an intervening insulating layer, the interconnect system comprising:
   a plurality of dual-damascene copper-containing vias that are unitary with the overlying elongated copper-containing line and are configured to electrically connect the underlying elongated conductive line and the overlying elongated copper-containing line in parallel through the intervening insulating layer.

11. An interconnect system according to claim 10 wherein the plurality of dual-damascene copper-containing vias are at an end of the overlying elongated copper-containing line.

12. An interconnect system according to claim 11 wherein the plurality of dual-damascene copper-containing vias consists of three copper-containing vias at the end of the overlying elongated copper-containing line.

13. An interconnect system according to claim 10 wherein the dual-damascene copper-containing vias comprise a conformal sublayer and a copper-containing sublayer on the conformal sublayer.

14. An interconnect system according to claim 11 wherein the underlying elongated conductive line is a first elongated underlying conductive line, the end of the overlying elongated copper-containing line is a first end of the overlying elongated copper-containing line and the plurality of dual-damascene copper-containing vias is a plurality of first dual-damascene copper-containing vias, the interconnect system further comprising a second underlying elongated conductive line on the integrated circuit substrate, and a plurality of second dual-damascene copper-containing vias at a second end of the overlying elongated copper-containing line that are configured to electrically connect the second underlying elongated conductive line and the second end of the overlying elongated copper-containing line in parallel through the intervening insulating layer.

15. A metallization method for an integrated circuit substrate, comprising:
   forming an elongated conductive line on the integrated circuit substrate;
   forming an insulating layer on the integrated circuit substrate including on the elongated conductive line, the insulating layer including a groove and a plurality of vias in the groove that expose the elongated conductive line; and
   forming a unitary dual-damascene layer comprising copper in the groove and in the plurality of vias in the groove.

16. A method according to claim 15 wherein the plurality of vias are at an end of the groove.

17. A method according to claim 16 wherein the plurality of vias consists of three vias at the end of the groove.

18. A method according to claim 15 wherein the forming a unitary dual-damascene layer comprising copper comprises:
   forming a unitary dual-damascene conformal sublayer in the groove and in the plurality of vias in the groove; and
   forming a unitary dual-damascene sublayer comprising copper on the conformal sublayer.

19. A method according to claim 15 wherein the forming a unitary dual-damascene layer comprising copper comprises forming a layer comprising copper that completely fills the groove and completely fills the plurality of vias in the groove.

20. A method according to claim 16 wherein the elongated conductive line is a first elongated conductive line, the end of the groove is a first end of the groove and the plurality of vias is a plurality of first vias, the method further comprising forming a second elongated conductive line on the integrated circuit substrate, the forming an insulating layer further comprising forming an insulating layer including a plurality of second vias at a second end of the groove that expose the second elongated conductive line and wherein the forming a unitary dual-damascene layer comprising copper further comprises forming a unitary dual-damascene layer comprising copper in the plurality of second vias.

21. A method according to claim 15 wherein the unitary dual-damascene layer comprising copper in the plurality of vias electrically connects the unitary dual-damascene layer comprising copper in the grooves and the elongated conductive line.

22. A method according to claim 21 wherein the unitary dual-damascene layer comprising copper in the plurality of vias electrically connects the layer comprising copper in the grooves and the elongated conductive line in parallel.

23. A method according to claim 20 wherein the plurality of second vias at the second end of the groove consists of three vias at the second end of the groove.

* * * * *